(12) United States Patent
Lin et al.

(10) Patent No.: US 9,190,319 B2
(45) Date of Patent: Nov. 17, 2015

(54) METHOD FOR FORMING INTERCONNECT STRUCTURE

(71) Applicant: Taiwan Semiconductor Manufacturing Company, Ltd., Hsin-Chu (TW)

(72) Inventors: Hsuan-Han Lin, Kaohsiung (TW); Jhu-Ming Song, Nantou (TW); Mu-Yi Lin, Taichung (TW); Kuang-Hsin Chen, Jung-Li (TW); Bor-Zen Tien, Hsin-Chu (TW); Tzong-Sheng Chang, Chubei (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 3 days.

(21) Appl. No.: 13/791,076

(22) Filed: Mar. 8, 2013

(65) Prior Publication Data

US 2014/0252621 A1 Sep. 11, 2014

(51) Int. Cl.
*H01L 21/768* (2006.01)
*H01L 23/532* (2006.01)
*H01L 23/00* (2006.01)
*H01L 21/285* (2006.01)

(52) U.S. Cl.
CPC .... *H01L 21/76807* (2013.01); *H01L 21/76843* (2013.01); *H01L 23/53238* (2013.01); *H01L 24/00* (2013.01); *H01L 21/2855* (2013.01); *H01L 21/28562* (2013.01); *H01L 23/53228* (2013.01); *H01L 2221/1015* (2013.01); *H01L 2924/13091* (2013.01)

(58) Field of Classification Search
CPC ............... H01L 21/76807; H01L 2221/1015
USPC ................................. 438/585; 257/E23.142
See application file for complete search history.

(56) References Cited

U.S. PATENT DOCUMENTS

| 6,215,149 B1 | 4/2001 | Lee et al. | |
|---|---|---|---|
| 2003/0080334 A1* | 5/2003 | Yoshida | 257/48 |
| 2005/0250320 A1* | 11/2005 | Tsai et al. | 438/672 |

FOREIGN PATENT DOCUMENTS

| KR | 20000014214 A | 3/2000 |
|---|---|---|
| KR | 20060098361 A | 9/2006 |
| KR | 100701426 B1 | 3/2007 |
| KR | 1020080036679 A | 4/2008 |
| WO | 2005024906 A2 | 3/2005 |

* cited by examiner

*Primary Examiner* — Amar Movva
(74) *Attorney, Agent, or Firm* — Slater & Matsil, L.L.P.

(57) ABSTRACT

A method for forming interconnect structures comprises forming a metal line made of a first conductive material over a substrate, depositing a dielectric layer over the metal line, patterning the dielectric layer to form an opening, depositing a first barrier layer on a bottom and sidewalls of the opening using an atomic layer deposition technique, depositing a second barrier layer over the first barrier layer, wherein the first barrier layer is coupled to ground and forming a pad made of a second conductive material in the opening.

19 Claims, 7 Drawing Sheets

METHOD FOR FORMING INTERCONNECT STRUCTURE

BACKGROUND

The semiconductor industry has experienced rapid growth due to continuous improvements in the integration density of a variety of electronic components (e.g., transistors, diodes, resistors, capacitors, etc.). For the most part, this improvement in integration density has come from repeated reductions in minimum feature size, which allows more components to be integrated into a given area. As semiconductor technologies evolve, wafer-level chip scale package structures have emerged as an effective alternative to further reduce the physical size of semiconductor devices.

In a wafer-level chip scale package structure, active devices such as transistors and the like are formed at the top surface of a substrate of the wafer-level chip scale package structure. A variety of metallization layers comprising interconnect structures are formed over the substrate. A metal pad is formed over the top metallization layer and electrically coupled to the interconnect structures. A passivation layer and a first polymer layer may be formed over the metal pad. The metal pad is exposed through the openings in the passivation layer and the first polymer layer.

Interconnection structures of a semiconductor device may comprise a plurality of lateral interconnections such as metal lines and a plurality of vertical interconnections such as vias. Various active circuits of the semiconductor may be coupled to external circuits through a variety of conductive channels formed by the vertical and lateral interconnections.

Interconnection structures of a semiconductor device can be fabricated using suitable semiconductor fabrication techniques such as etching, Damascene and the like. Damascene processes can be divided into categories, namely single damascene processes and dual damascene processes. In single damascene technology, a metal via and its adjacent metal line may have different process steps. As a result, each may require a chemical mechanical planarization process to clean the surface. In contrast, in dual damascene technology, a metal via and its adjacent metal line may be formed within a single damascene trench. As a result, one chemical mechanical planarization process is required in a dual damascene process to form the metal via and its adjacent metal line.

BRIEF DESCRIPTION OF THE DRAWINGS

For a more complete understanding of the present invention, and the advantages thereof, reference is now made to the following descriptions taken in conjunction with the accompanying drawings, in which.

Corresponding numerals and symbols in the different figures generally refer to corresponding parts unless otherwise indicated. The figures are drawn to clearly illustrate the relevant aspects of the various embodiments and are not necessarily drawn to scale.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

The present invention will be described with respect to preferred embodiments in a specific context, a method for forming interconnect structures for a semiconductor device including a transistor. The invention may also be applied, however, to a variety of semiconductor devices. Hereinafter, various embodiments will be explained in detail with reference to the accompanying drawings.

Figure 1:
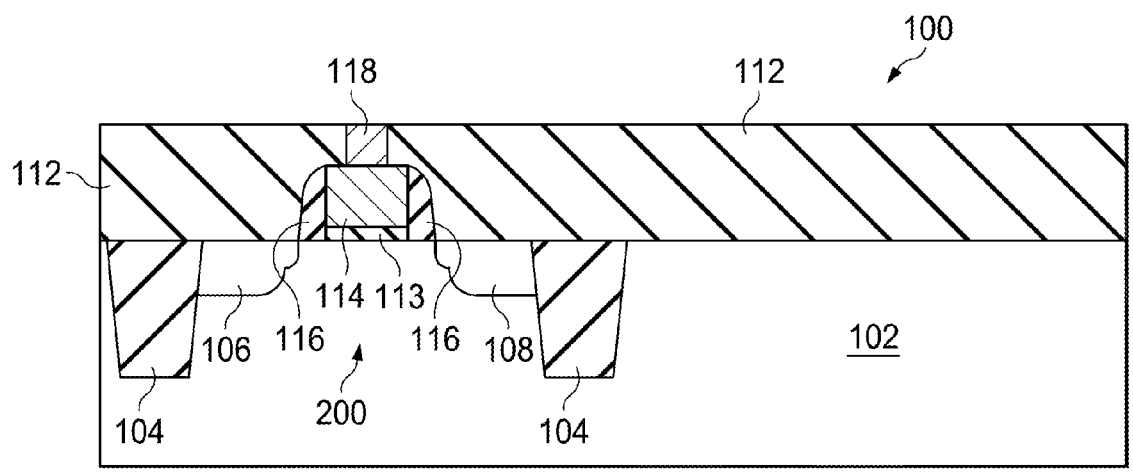
FIG. 1 illustrates a cross sectional view of a semiconductor device after various electrical circuits have been formed in the substrate in accordance with various embodiments of the present disclosure.

FIG. 1 illustrates a cross sectional view of a semiconductor device after various electrical circuits have been formed in the substrate in accordance with various embodiments of the present disclosure. The semiconductor device 100 includes a transistor device 200, which is formed in a substrate 102. As shown in FIG. 1, there may be two isolation regions 104 formed on opposite sides of the transistor device 200.

The transistor device 200 includes a first drain/source region 106 and a second drain/source region 108. The first drain/source region 106 and the second drain/source region 108 are formed on opposite sides of a gate structure of the transistor device 200. The gate structure is formed in a dielectric layer 112 and over the substrate 102. The gate structure may comprise a gate dielectric layer 113, a gate electrode 114 and spacers 116.

The substrate 102 may be formed of silicon, although it may also be formed of other group III, group IV, and/or group V elements, such as silicon, germanium, gallium, arsenic, and combinations thereof. The substrate 102 may also be in the form of silicon-on-insulator (SOI). The SOI substrate may comprise a layer of a semiconductor material (e.g., silicon, germanium and/or the like) formed over an insulator layer (e.g., buried oxide or the like), which is formed in a silicon substrate. In addition, other substrates that may be used include multi-layered substrates, gradient substrates, hybrid orientation substrates and/or the like.

The substrate 102 may further comprise a variety of electrical circuits (not shown). The electrical circuits formed on the substrate 102 may be any type of circuitry suitable for a particular application. In accordance with an embodiment, the electrical circuits may include various n-type metal-oxide semiconductor (NMOS) and/or p-type metal-oxide semiconductor (PMOS) devices such as transistors, capacitors, resistors, diodes, photo-diodes, fuses and/or the like. The electrical circuits may be interconnected to perform one or more functions. The functions may include memory structures, processing structures, sensors, amplifiers, power distribution, input/output circuitry and/or the like. One of ordinary skill in the art will appreciate that the above examples are provided for illustrative purposes only and are not intended to limit the various embodiments to any particular applications.

The substrate 102 may comprise a variety of electrical circuits such as metal oxide semiconductor (MOS) transistors (e.g., transistor device 200) and the associated contact plugs (e.g., contact plug 118). For simplicity, only a single MOS transistor and a single contact plug are presented to illustrate the innovative aspects of various embodiments.

The isolation regions 104 may be shallow trench isolation (STI) regions. The STI regions may be formed by etching the substrate 102 to form a trench and filling the trench with a dielectric material as is known in the art. For example, the isolation regions 104 may be filled with a dielectric material such as an oxide material, a high-density plasma (HDP) oxide and/or the like. A planarization process such as a chemical mechanical planarization (CMP) process may be applied to the top surface so that the excess dielectric material may be removed as a result.

The gate dielectric layer 113 may be a dielectric material such as silicon oxide, silicon oxynitride, silicon nitride, an oxide, a nitrogen-containing oxide, a combination thereof and/or the like. The gate dielectric layer 113 may have a relative permittivity value greater than about 4. Other examples of such materials include aluminum oxide, lanthanum oxide, hafnium oxide, zirconium oxide, hafnium oxynitride, any combinations thereof and/or the like. In an embodiment in which the gate dielectric layer 113 comprises an oxide layer, the gate dielectric layer 113 may be formed by suitable deposition processes such as a plasma enhanced chemical vapor deposition (PECVD) process using tetraethoxysilane (TEOS) and oxygen as a precursor. In accordance with an embodiment, the gate dielectric layer 113 may be of a thickness in a range from about 8 Å to about 200 Å.

The gate electrode 114 may comprise a conductive material, such as a metal (e.g., tantalum, titanium, molybdenum, tungsten, platinum, aluminum, hafnium, ruthenium), a metal silicide (e.g., titanium silicide, cobalt silicide, nickel silicide, tantalum silicide), a metal nitride (e.g., titanium nitride, tantalum nitride), doped poly-crystalline silicon, other conductive materials, combinations thereof and/or the like. In an embodiment in which the gate electrode 114 is formed of poly-silicon, the gate electrode 114 may be formed by depositing doped or undoped poly-silicon by low-pressure chemical vapor deposition (LPCVD) to a thickness in the range of about 400 Å to about 2,400 Å.

The spacers 116 may be formed by blanket depositing one or more spacer layers (not shown) over the gate electrode 114 and the substrate 102. The spacers 116 may comprise suitable dielectric materials such as SiN, oxynitride, SiC, SiON, oxide and/or the like. The spacers 116 may be formed by commonly used techniques such as chemical vapor deposition (CVD), PECVD, sputter and/or the like.

The first and second drain/source regions 106 and 108 may be formed in the substrate 102 on opposing sides of the gate dielectric layer 113. In an embodiment in which the substrate 102 is an n-type substrate, the drain/source regions 106 and 108 may be formed by implanting appropriate p-type dopants such as boron, gallium, indium and/or the like. Alternatively, in an embodiment in which the substrate 102 is a p-type substrate, the drain/source regions 106 and 108 may be formed by implanting appropriate n-type dopants such as phosphorous, arsenic and/or the like.

As shown in FIG. 1, the dielectric layer 112 is formed over the substrate 102. There may be a contact plug 118 formed in the dielectric layer 112. The contact plug 118 is formed over the gate electrode 114 to provide an electrical connection between the transistor device 200 and the interconnect structure (not shown but illustrated in FIG. 2) formed over the dielectric layer 112.

The contact plug 118 may be formed by using photolithography techniques to deposit and pattern a photoresist material (not shown) on the dielectric layer 112. A portion of the photoresist is exposed according to the location and shape of the contact plug 118. An etching process, such as an anisotropic dry etch process, may be used to create an opening in the dielectric layer 112.

A conductive material is then filled in the opening. The conductive material may be deposited by using CVD, plasma vapor deposition (PVD), atomic layer deposition (ALD) and/or the like. The conductive material is deposited in the contact plug opening. Excess portions of the conductive material are removed from the top surface of the dielectric layer 112 by using a planarization process such as CMP. The conductive material may be copper, tungsten, aluminum, silver, titanium, titanium nitride, tantalum and any combinations thereof and/or the like.

The dielectric layer 112 is formed on top of the substrate 102. The dielectric layer 112 may be formed, for example, of a low-K dielectric material, such as silicon oxide. The dielectric layer 112 may be formed by any suitable method known in the art, such as spinning, CVD and PECVD. It should also be noted that one skilled in the art will recognize while FIG. 1 illustrates a single dielectric layer, the dielectric layer 112 may comprise a plurality of dielectric layers.

Figure 2:
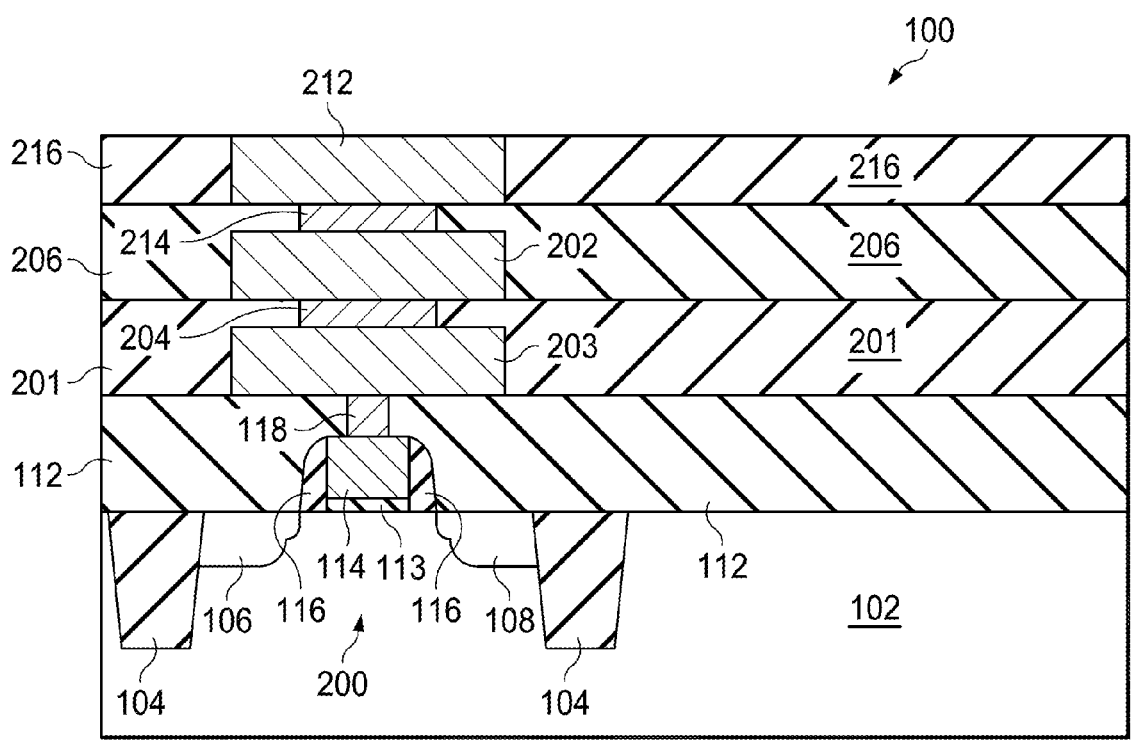
FIG. 2 illustrates a cross sectional view of the semiconductor device shown in FIG. 1 after a plurality of metal lines are formed over the substrate in accordance with various embodiments of the present disclosure.

FIG. 2 illustrates a cross sectional view of the semiconductor device shown in FIG. 1 after a plurality of metal lines are formed over the substrate in accordance with various embodiments of the present disclosure. A first inter-metal dielectric layer 201 is formed over the dielectric layer 112. As shown in FIG. 2, there may be one metal line 203 formed in the first inter-metal dielectric layer 201. As shown in FIG. 2, two additional metallization layers are formed over the first metallization layer. While FIG. 2 shows two metallization layers formed over the first metallization layer, one skilled in the art will recognize that more inter-metal dielectric layers (not shown) and the associated metal lines and plugs (not shown) may be formed between the metallization layers (e.g., layers 206 and 216) shown in FIG. 2. In particular, the layers between the metallization layers shown in FIG. 2 may be formed by alternating layers of dielectric (e.g., extremely low-k dielectric material) and conductive materials (e.g., copper).

It should further be noted that the metallization layers shown in FIG. 2 may be formed by a dual damascene process, although other suitable techniques such as deposition, single damascene may alternatively be used. The dual damascene process is well known in the art, and hence is not discussed herein.

The second metal line 202 and the plug 204 are formed by a dual damascene process. The second metal line 202 is embedded in a second inter-metal dielectric layer 206, which is similar to the first inter-metal dielectric layer 201. The plug 204 is formed in the first inter-metal dielectric layer 201. More particularly, the second metal line 202 and the metal line 203 are coupled to each other through the plug 204.

The second metal line 202 and the plug 204 may be formed of metal materials such as copper, copper alloys, aluminum, silver, gold, any combinations thereof and/or the like. The third metal line 212 and the plug 214 are similar to the second metal line 202 and the plug 204, and hence are not discussed to avoid repetition.

Figure 3:
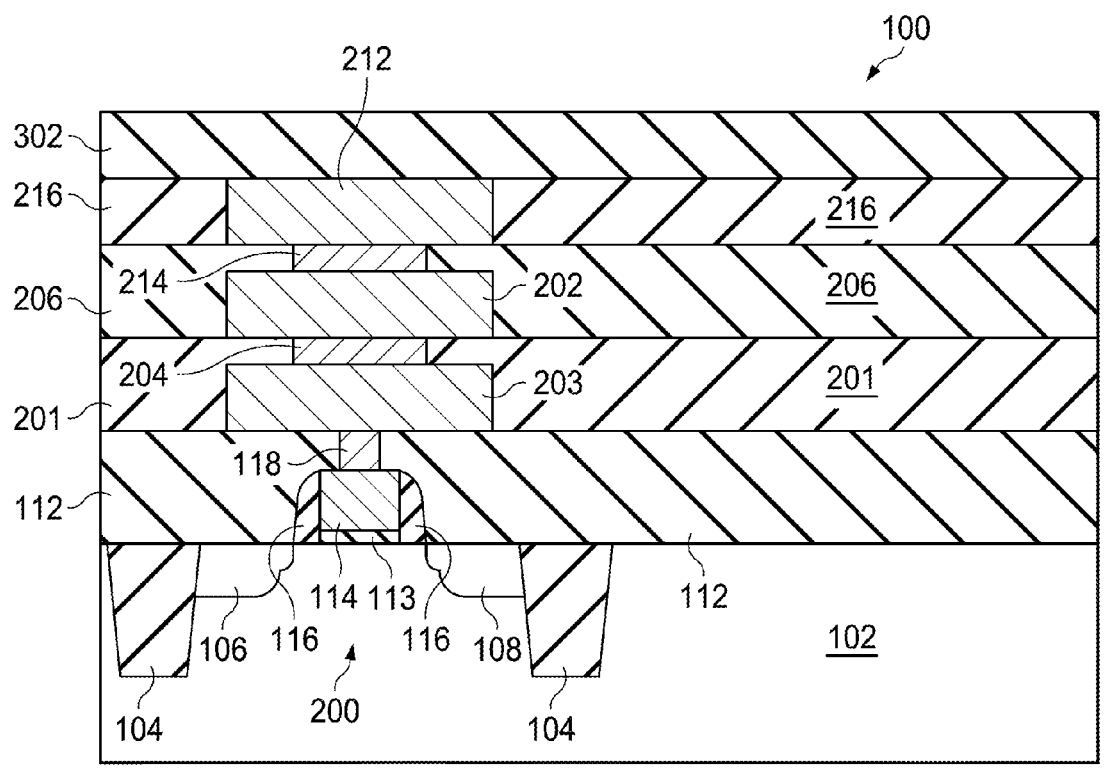
FIG. 3 illustrates a cross sectional view of the semiconductor device shown in FIG. 2 after a passivation layer is formed on the top of the inter-metal dielectric layer in accordance with various embodiments of the present disclosure.

FIG. 3 illustrates a cross sectional view of the semiconductor device shown in FIG. 2 after a passivation layer is formed on the top of the inter-metal dielectric layer in accordance with various embodiments of the present disclosure. The passivation layer 302 is formed of non-organic materials such as un-doped silicate glass, silicon nitride, silicon oxide, silicon oxynitride, boron-doped silicon oxide, phosphorus-doped silicon oxide and/or the like. Alternatively, the passivation layer 302 may be formed of low-k dielectric such as carbon doped oxide and/or the like. In addition, extremely low-k (ELK) dielectrics such as porous carbon doped silicon dioxide can be employed to form the passivation layer 154. The passivation layer 302 may be formed through any suitable techniques such as CVD.

Figure 4:
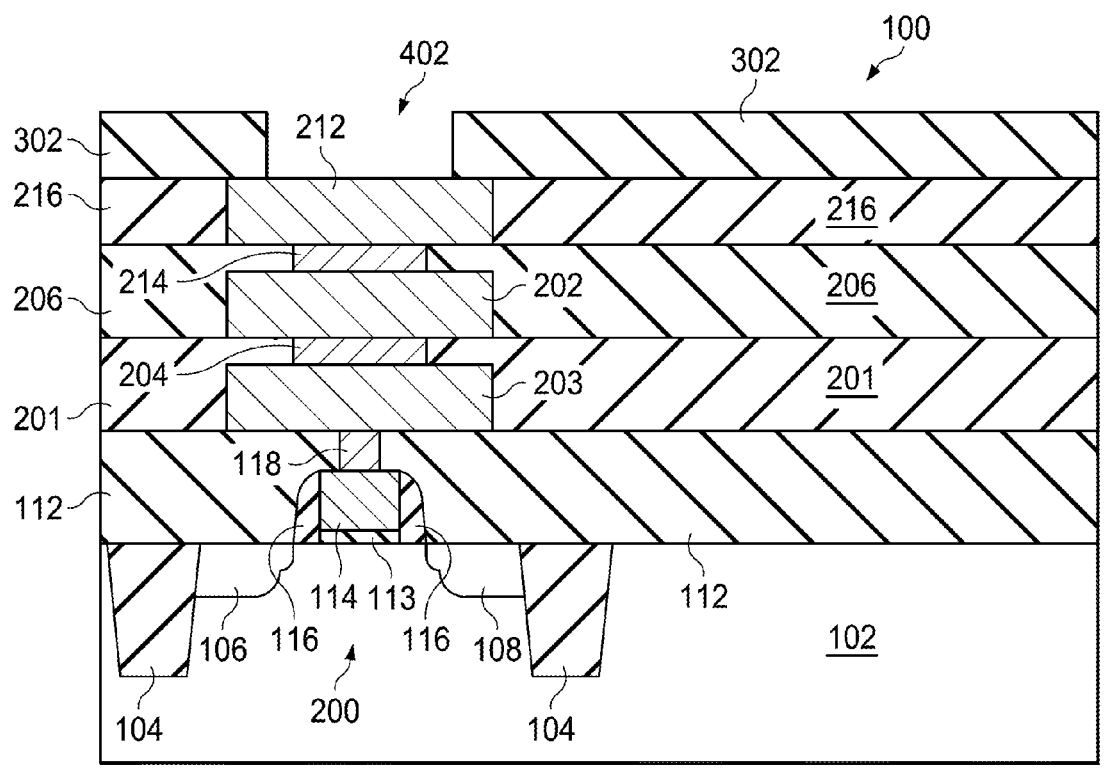
FIG. 4 illustrates a cross sectional view of the semiconductor device shown in FIG. 3 after a patterning process is applied to the passivation layer in accordance with various embodiments of the present disclosure.

FIG. 4 illustrates a cross sectional view of the semiconductor device shown in FIG. 3 after a patterning process is applied to the passivation layer in accordance with various embodiments of the present disclosure. The patterning process may be implemented by using suitable patterning techniques such as an etching process, a laser ablation process and/or the like. In accordance with the shape and location of the pad (not shown but illustrated in FIG. 8) of the semiconductor device 100, an etching process such as an anisotropic dry etch process or a laser beam (not shown) may be applied to the top surface of the passivation layer 302. As a result, a portion of the passivation layer 302 is removed to form an opening 402 as shown in FIG. 4.

Figure 5:
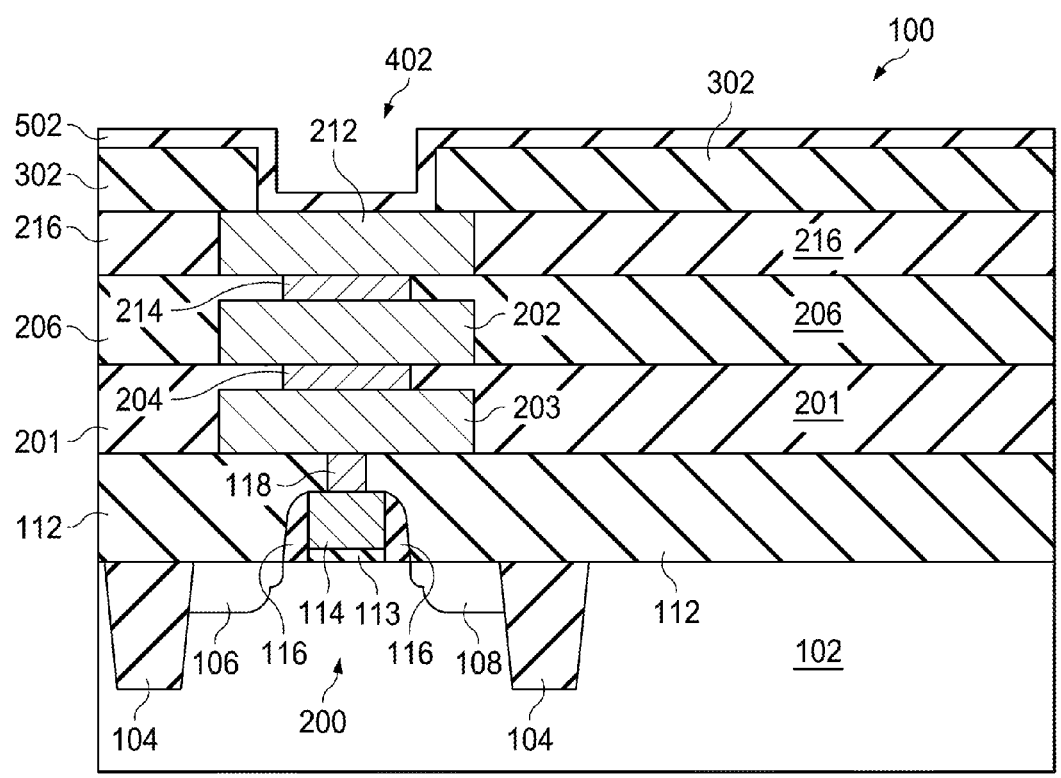
FIG. 5 illustrates a cross sectional view of the semiconductor device shown in FIG. 4 after a first barrier layer is formed over the top surface of the semiconductor device in accordance with various embodiments of the present disclosure.

FIG. 5 illustrates a cross sectional view of the semiconductor device shown in FIG. 4 after a first barrier layer is formed over the top surface of the semiconductor device in accordance with various embodiments of the present disclosure. The first barrier layer 502 may be formed of suitable materials such as tantalum nitride (TaN) and the like. The first barrier layer 502 is deposited on the bottom, sidewalls of the opening 402 as well as the top surface of the passivation layer 302 through an ALD process.

The first barrier layer 502 may be of a thickness of about 10 angstroms in accordance with some embodiments. In addition, the first barrier layer 502 may be coupled to the ground plane of the semiconductor device 100. The ground-connected barrier layer such as the first barrier layer 502 helps to release the charge in the subsequent PVD process. The PVD process will be described below with respect to FIG. 6.

Figure 6:
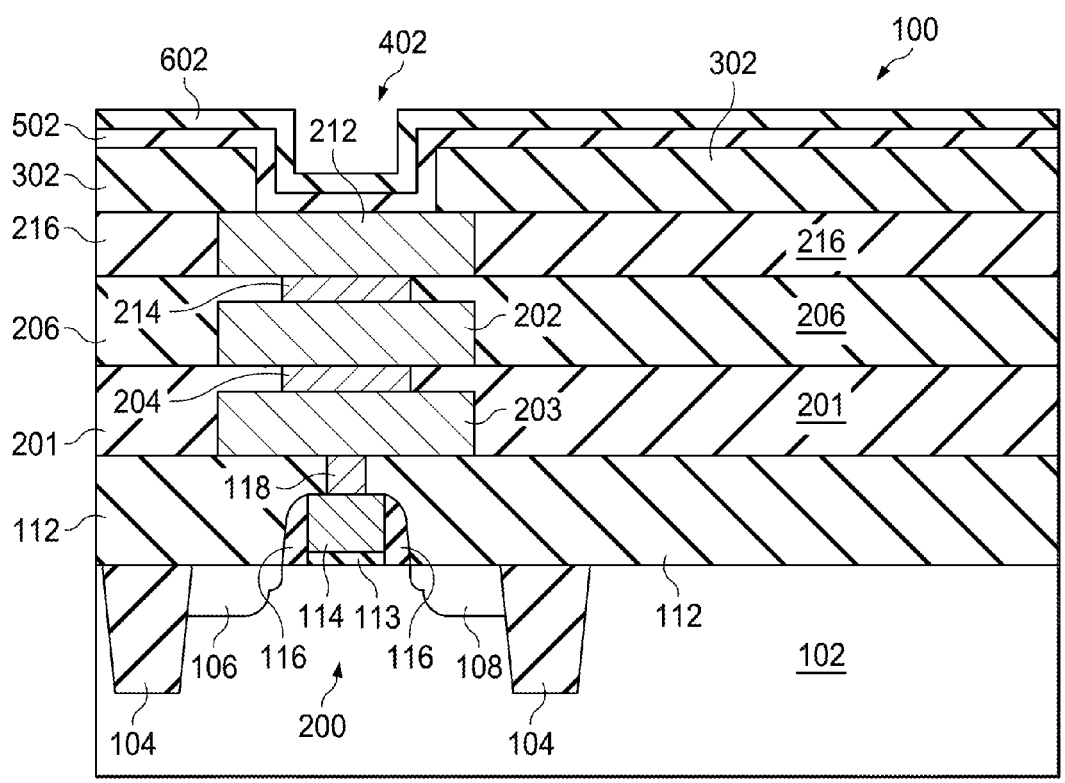
FIG. 6 illustrates a cross sectional view of the semiconductor device shown in FIG. 5 after a second barrier layer is formed over the top surface of the semiconductor device in accordance with various embodiments of the present disclosure.

FIG. 6 illustrates a cross sectional view of the semiconductor device shown in FIG. 5 after a second barrier layer is formed over the top surface of the semiconductor device in accordance with various embodiments of the present disclosure. The second barrier layer 602 is formed over the first barrier layer 502. The second barrier layer 602 may be of the same material as the first barrier layer 502. Alternatively, the second barrier layer 602 may be formed of other suitable materials such as titanium, tantalum and combinations thereof and/or the like. The second barrier layer 602 may be of a thickness of about 600 angstroms in accordance with some embodiments. Both the first barrier layer 502 and the second barrier layer 602 may function as a barrier to prevent copper (e.g., metal line 212) from diffusing into the surrounding areas. The second barrier layer 602 may be deposited on the first barrier layer 502 using a plasma based deposition process such as PVD.

One advantageous feature of having the first barrier layer 502 is that the first barrier layer 502 is deposited over the semiconductor device through a non plasma based deposition process such as ALD. The ALD process does not cause a plasma-induced damage (PID) to the gate dielectric layer 113, which is electrically coupled to the metal line 212. Furthermore, during the PVD process for forming the second barrier layer 602, the ground-connected barrier layer 502 helps to release the charge of the PVD process so as to avoid the PID to the gate dielectric layer 113.

Figure 7:
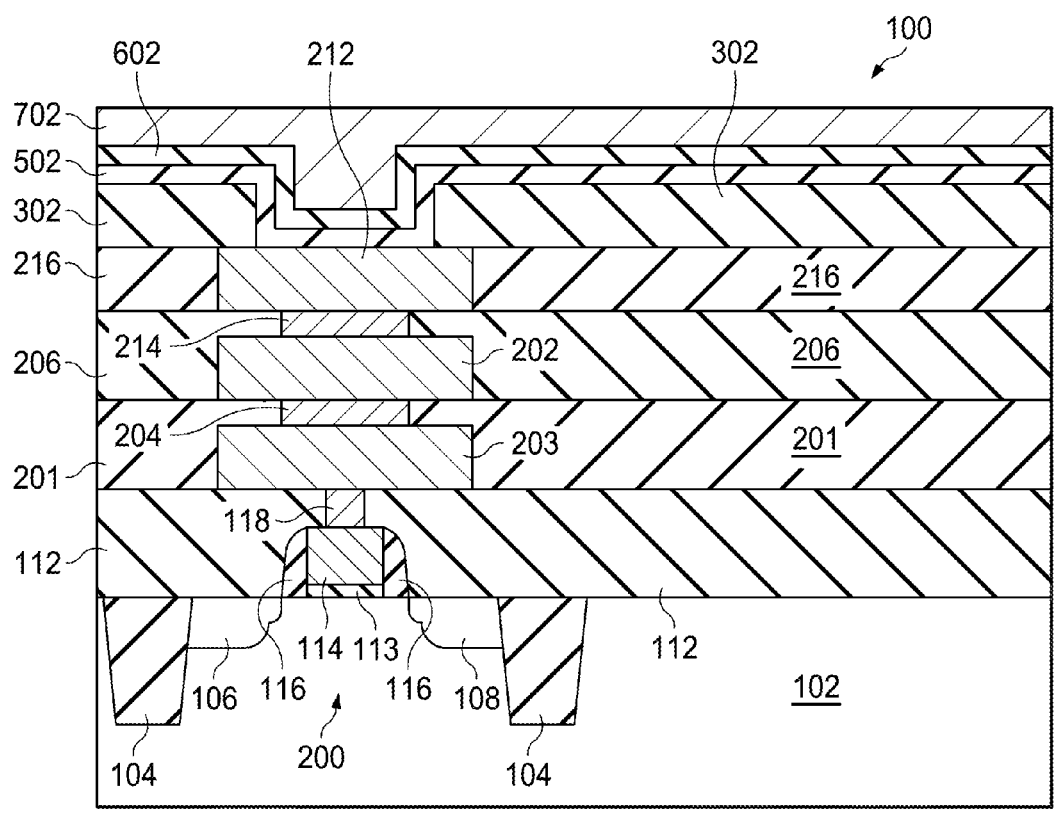
FIG. 7 illustrates a cross sectional view of the semiconductor device shown in FIG. 6 after a pad layer is formed on top of the second barrier layer in accordance with in accordance with various embodiments of the present disclosure.

FIG. 7 illustrates a cross sectional view of the semiconductor device shown in FIG. 6 after a pad layer is formed on top of the second barrier layer in accordance with in accordance with various embodiments of the present disclosure. As shown in FIG. 7, a conductive material may be filled in the opening (e.g., opening 402 shown in FIG. 6) to form the pad layer 702. The conductive material may be aluminum copper, but can be any suitable conductive materials, such as copper alloys, aluminum, tungsten, silver, any combinations thereof and/or the like. The pad layer 702 may be formed by suitable techniques such as CVD, PVD, an electro-less plating process, electroplating and/or the like.

Figure 8:
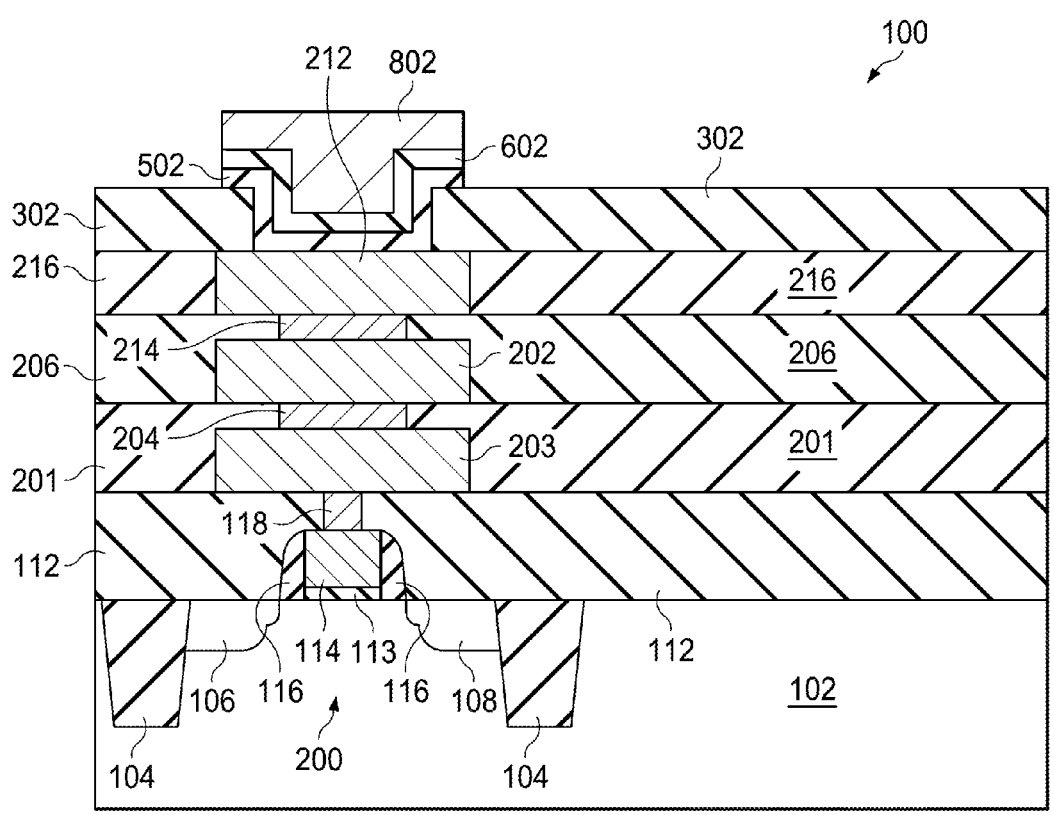
FIG. 8 illustrates a cross sectional view of the semiconductor device shown in FIG. 7 after an etching process is applied to the pad layer in accordance with in accordance with various embodiments of the present disclosure.

FIG. 8 illustrates a cross sectional view of the semiconductor device shown in FIG. 7 after an etching process is applied to the pad layer in accordance with in accordance with various embodiments of the present disclosure. In consideration with the shape and location of the pad of the semiconductor device 100, the pad layer 702 may be patterned and portions of the barrier layers and the pad layer 72 may be removed to form the pad 802. The removal process may be a suitable etching process such as wet-etching, dry-etching and/or the like. The detailed operations of either the dry etching process or the wet etching process are well known in the art, and hence are not discussed herein to avoid repetition.

Figure 9:
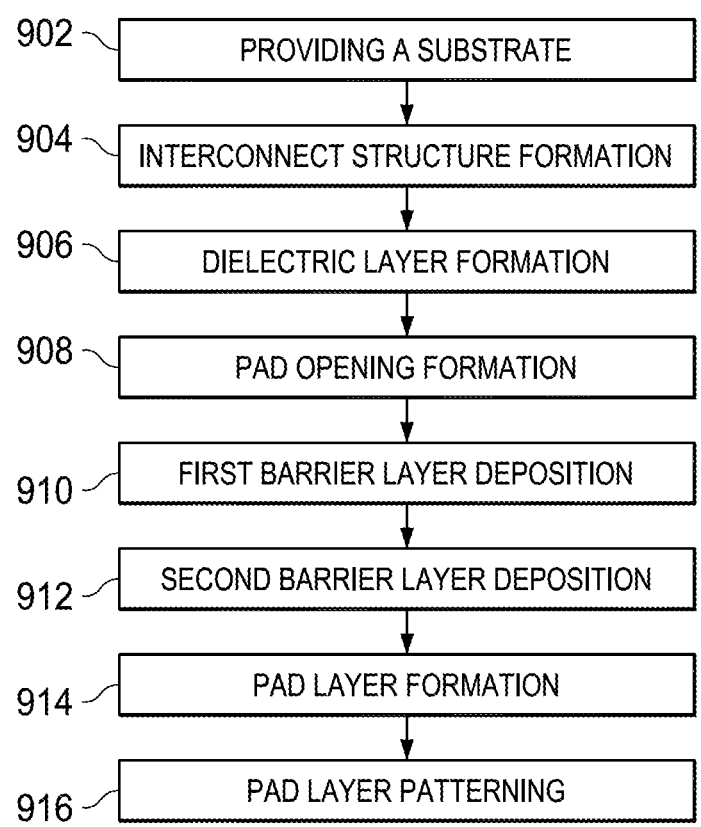
FIG. 9 is a process flow of the fabrication steps shown in FIGS. 1-8.

FIG. 9 is a process flow of the fabrication steps shown in FIGS. 1-8. At step 902, a transistor device is formed in a substrate and a gate structure is formed over the substrate in a dielectric layer. The formation of the gate structure as well as the other parts of the transistor is discussed in detail with respect to FIG. 1. At step 904, a plurality of interconnect structures such as metal lines are formed over the substrate as shown in FIG. 2. At step 906, a dielectric layer is formed over a top metal line of the interconnect structure.

At step 908, an opening is formed in the dielectric layer as shown in FIG. 4. At step 910, as shown in FIG. 5, a first barrier layer is deposited on the bottom as well as the sidewalls of the opening through an ALD process. At step 912, as shown in FIG. 6, a second barrier layer is formed over the first barrier layer through a PVD process. During the PVD process, the first barrier layer is coupled to ground. At step 914, as shown in FIG. 7, a PAD layer is formed through suitable deposition techniques. At step 916, the pad layer is patterned to form a pad as shown in FIG. 8.

In accordance with an embodiment, an apparatus comprises a metal line made of a first conductive material and formed over a substrate, a dielectric layer formed over the metal line, wherein the dielectric layer includes a pad, and wherein the pad is formed of a second conductive material, a first barrier layer formed between the metal line and the pad, wherein the first barrier layer is deposited through an atomic layer deposition technique and a second barrier layer formed over the first barrier layer, wherein the first barrier layer is coupled to ground when the second barrier layer is deposited over the first barrier layer.

In accordance with an embodiment, a device comprises a metal line coupled to a gate structure of a transistor formed in a substrate, wherein the metal line is formed of a first conductive material, a dielectric layer formed over the metal line and a pad formed in the dielectric layer and over the metal line, wherein the pad is formed of a second conductive material.

The device further comprises a first barrier layer formed between the metal line and the pad, wherein the first barrier layer is formed by an atomic layer deposition process and a second barrier layer formed over the first barrier, wherein the second barrier layer is formed by a plasma-based deposition process.

In accordance with an embodiment, a method comprises forming a gate structure over a substrate, wherein the gate structure comprises a gate dielectric layer over the substrate and a gate electrode over the gate dielectric layer. The method further comprises forming a plurality of interconnect components over the gate structure, wherein the interconnect components are electrically coupled to the gate structure, depositing a dielectric layer over a top metal line of the interconnect components, forming an opening in the dielectric layer, depositing a first barrier layer on a bottom and sidewalls of the opening using a first deposition technique, depositing a second barrier layer over the first barrier layer using a second deposition technique and forming a pad in the opening.

Although embodiments of the present invention and its advantages have been described in detail, it should be understood that various changes, substitutions and alterations can be made herein without departing from the spirit and scope of the invention as defined by the appended claims.

Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A method comprising:
   forming a gate structure over a substrate, wherein the gate structure comprises:
     a gate dielectric layer over the substrate; and
     a gate electrode over the gate dielectric layer;
   forming a plurality of interconnect components over the gate structure, wherein the interconnect components are electrically coupled to the gate structure;
   depositing a dielectric layer over a top metal line of the interconnect components;
   forming an opening in the dielectric layer;
   depositing a first barrier layer on a bottom and sidewalls of the opening using a first deposition technique;
   depositing a second barrier layer over the first barrier layer using a second deposition technique, wherein during the step of depositing the second barrier layer over the first barrier layer, the first barrier layer is connected to ground; and
   forming a pad in the opening.

2. The method of claim 1, further comprising:
   forming the first barrier layer using an atomic layer deposition process, wherein the first barrier layer is formed of tantalum nitride.

3. The method of claim 1, further comprising:
   forming the second barrier layer over the first barrier layer using a plasma vapor deposition process, wherein the second barrier layer is formed of tantalum nitride.

4. The method of claim 1, further comprising:
   etching the dielectric layer to form the opening using a dry etching process.

5. The method of claim 1, wherein:
   the top metal line is formed of copper; and
   the pad is formed of aluminum copper.

6. The method of claim 1, further comprising:
   depositing the dielectric layer over the top metal line through a chemical vapor deposition process.

7. A method comprising:
   forming a gate structure over a substrate;
   depositing a plurality of metallization layers over the gate structure, wherein the plurality of metallization layers comprise a plurality of metal lines and at least one metal line is electrically coupled to the gate structure;
   depositing a dielectric layer over a top metal line;
   patterning the dielectric layer to form a trench in the dielectric layer;
   depositing a first barrier layer on a bottom and sidewalls of the trench using a first deposition process; and
   depositing a second barrier layer over the first barrier layer using a second deposition process, wherein during the step of depositing the second barrier layer over the first barrier layer, the first barrier layer is coupled to ground.

8. The method of claim 7, further comprising:
   depositing a gate dielectric layer over the substrate; and
   forming a gate electrode over the gate dielectric layer.

9. The method of claim 7, further comprising:
   filling the trench with a conductive material to form a pad layer; and
   applying an etching process to the pad layer to form a connection pad.

10. The method of claim 7, further comprising:
    depositing the first barrier layer on the bottom and the sidewalls of the trench using an atomic layer deposition process.

11. The method of claim 7, further comprising:
    depositing the second barrier layer over the first barrier layer using a plasma-based deposition process, wherein the first barrier layer is coupled to ground.

12. The method of claim 11, wherein:
    the plasma-based deposition process is a plasma vapor deposition process.

13. The method of claim 7, wherein:
    the first barrier layer is formed of tantalum nitride.

14. A method comprising:
    forming a plurality of metal lines over a substrate;
    depositing a dielectric layer over a top metal line;
    patterning the dielectric layer to form an opening in the dielectric layer;
    depositing a first barrier layer on a bottom and sidewalls of the opening using a plasma-free deposition process; and
    depositing a second barrier layer over the first barrier layer using a plasma-based deposition process, wherein during the step of depositing the second barrier layer over the first barrier layer, the first barrier layer is coupled to ground.

15. The method of claim 14, wherein:
the plasma-free deposition process is an atomic layer deposition process.
16. The method of claim 14, wherein:
the plasma-based deposition process is a plasma vapor deposition process.
17. The method of claim 14, wherein:
the dielectric layer is a passivation layer formed of non-organic materials.
18. The method of claim 14, further comprising:
forming a pad layer over the substrate, wherein a bottom portion of the pad layer is in the opening.
19. The method of claim 18, further comprising:
patterning the pad layer to form a pad, wherein the pad is formed of aluminum copper.

\* \* \* \* \*